(12) United States Patent
Gupta et al.

(10) Patent No.: US 9,824,175 B1
(45) Date of Patent: Nov. 21, 2017

(54) METHOD AND SYSTEM OF EVALUATION OF VALIDITY OF A REFINEMENT RULE FOR A HARDWARE EMULATION

(71) Applicant: Cadence Design Systems, Inc., San Jose, CA (US)

(72) Inventors: Hemant Gupta, New Delhi (IN); Nili Segal, Nirit (IL); Yael Kinderman, Givat Shmuel (IL); Oded Oren, Tel-Aviv (IL)

(73) Assignee: Cadence Design Systems, Inc., San Jose, CA (US)

( * ) Notice: Subject to any disclaimer, the term of this patent is extended or adjusted under 35 U.S.C. 154(b) by 236 days.

(21) Appl. No.: 14/806,745

(22) Filed: Jul. 23, 2015

Related U.S. Application Data

(60) Provisional application No. 62/176,898, filed on Oct. 1, 2014.

(51) Int. Cl.
*G06F 17/00* (2006.01)
*G06F 17/50* (2006.01)
*G06F 9/455* (2006.01)

(52) U.S. Cl.
CPC ........ *G06F 17/5081* (2013.01); *G06F 17/505* (2013.01); *G06F 17/5027* (2013.01); *G06F 9/455* (2013.01); *G06F 2217/14* (2013.01)

(58) Field of Classification Search
None
See application file for complete search history.

(56) References Cited

U.S. PATENT DOCUMENTS

| | | | | |
|---|---|---|---|---|
| 6,332,201 B1 * | 12/2001 | Chin | ............... | G01R 31/318357 703/14 |
| 6,718,521 B1 * | 4/2004 | Bentlage | ............. | G06F 17/5022 716/106 |
| 7,292,970 B1 * | 11/2007 | Hurlock | ........... | G01R 31/31835 703/13 |
| 7,734,559 B2 * | 6/2010 | Huelsman | ................ | G06N 5/02 703/7 |
| 9,262,567 B2 * | 2/2016 | Durand | ............... | G06F 17/5027 |
| 2004/0111249 A1 * | 6/2004 | Narahara | ............ | G06F 17/5022 703/22 |

* cited by examiner

*Primary Examiner* — Leigh Garbowski
(74) *Attorney, Agent, or Firm* — Pearl Cohen Zedek Latzer Baratz LLP

(57) ABSTRACT

A method for automatically verifying validity of application of a refinement rule includes calculating a set of values that characterize a hierarchy of elements of the emulation. A currently calculated value for a first element at a first level of the hierarchy is compared with a previously calculated value that characterized the first element at a previous time. If the currently calculated value is the same as the previously calculated value, application of the refinement rule is determined to be valid for unnamed entities of the first element. If the currently calculated value is different from the previously calculated value, each currently calculated value that characterizes a lower level element at a lower level of the hierarchy is compared with a corresponding previously calculated value to identify a change and it is determined whether the change invalidates application of the refinement rule to an unnamed entity of the emulation.

20 Claims, 3 Drawing Sheets

US 9,824,175 B1

METHOD AND SYSTEM OF EVALUATION OF VALIDITY OF A REFINEMENT RULE FOR A HARDWARE EMULATION

FIELD OF THE INVENTION

The present invention relates to hardware emulation. More particularly, the present invention relates to method and system of evaluation of validity of a refinement rule for a hardware emulation.

BACKGROUND OF THE INVENTION

One technique of examining and verifying a design of a hardware component, such as an integrated circuit, is to model operation of the design in software. For the purpose of modeling, the design or its functionality may be described as procedures, for example, using a hardware design language (HDL). For example, the HDL may represent various functions or operations of the hardware design as separate models or statements in the HDL code.

The software emulation of the hardware may be operated in different configurations to test or verify operation of various functionalities of the component. A test may cause execution of all or some of the statements of the HDL code. A fraction or percentage of the statements or other entities in the HDL code that are covered by a test may be referred to as coverage. Coverage may relate to the entire set of HDL code or to a part or block of HDL code. Coverage may refer to code (e.g., whether a block of code has been executed during a test), expressions (e.g., whether all possibilities in a truth table have been covered by a test), functionality, or other facets of the emulation.

In some cases, a user may choose to exclude a part of the HDL code from testing, coverage, or both. For example, the user may decide that the part of the code does not require testing in a particular context.

SUMMARY OF THE INVENTION

There is thus provided, in accordance with some embodiments of the present invention, a method for automatically verifying validity of application of a refinement rule, the method including: using a processor, calculating a set of currently calculated values, each currently calculated value characterizing an element in a hierarchy of elements of a hardware emulation and storing the currently calculated values in a storage device; using the processor, comparing a currently calculated value of the set for a first element at a first level of the hierarchy with a previously calculated value that is stored in the storage device and that characterized the first element at a previous time; if the currently calculated value that characterizes the first element is the same as the previously calculated value that characterized the first element at the previous time, determining that application of the refinement rule is valid for unnamed entities of the first element; and if the currently calculated value that characterizes the first element is different from the previously calculated value that characterized the first element at the previous time: using the processor, comparing each currently calculated value that characterizes a lower level element at a lower level of the hierarchy with a corresponding previously calculated value that is stored in the storage device and that characterized that lower level element at the previous time to identify a change in an element of the lower level elements; and using the processor, determining whether the identified change invalidates application of the refinement rule to an unnamed entity of the hardware emulation.

Furthermore, in accordance with some embodiments of the present invention, the first element includes a model.

Furthermore, in accordance with some embodiments of the present invention, the characteristic value is indicative of a value of a configuration flag.

Furthermore, in accordance with some embodiments of the present invention, calculating a value of the set of values includes applying a hash function to an element of the hierarchy of elements that is the characterized by that value.

Furthermore, in accordance with some embodiments of the present invention, the hash function is further applied to a current value of a configuration flag.

Furthermore, in accordance with some embodiments of the present invention, an element of the lower level elements includes a module, an instance of a module, or a concurrent block.

Furthermore, in accordance with some embodiments of the present invention, determining whether the identified change invalidates application of the refinement rule includes automatically adapting the refinement rule to the identified change.

Furthermore, in accordance with some embodiments of the present invention, determining whether the identified change invalidates application of the refinement rule to the unnamed entity includes determining that the unnamed entity does not exist.

Furthermore, in accordance with some embodiments of the present invention, the method includes ignoring the refinement rule.

Furthermore, in accordance with some embodiments of the present invention, the method includes presenting a refinement rule that is suspect for examination by a user.

There is further provided, in accordance with some embodiments of the present invention, a non-transitory computer readable storage medium having stored thereon instructions that when executed by a processor will cause the processor to perform the method of: calculating a set of currently calculated values for a hardware emulation, each currently calculated value characterizing an element in a hierarchy of elements of the emulation and storing the currently calculated values in a storage device; comparing a currently calculated value of the set for a first element at a first level of the hierarchy with a previously calculated value that is stored in the storage device and that characterized the first element at a previous time; determining that application of a refinement rule to an unnamed entity of the emulation is valid if the currently calculated value that characterizes the first element is the same as the previously calculated value that characterized the first element at the previous time; comparing each currently calculated value that characterizes a lower level element at a lower level of the hierarchy with a corresponding previously calculated value that is stored in the storage device and that characterized that lower level element at the previous time to identify a change in an element of the lower level elements if the currently calculated value that characterizes the first element is different from the previously calculated value that characterized the first element at the previous time; and determining whether the identified change invalidates application of the refinement rule to the unnamed entity.

Furthermore, in accordance with some embodiments of the present invention, the instructions include instruction to apply a hash function to an element of the hierarchy of elements calculate a value of the set of values that characterizes that element.

Furthermore, in accordance with some embodiments of the present invention, the element of the hierarchy of elements includes a model, a module, an instance of a module, or a concurrent block.

Furthermore, in accordance with some embodiments of the present invention, the instructions include instruction to automatically adapt the refinement rule to the identified change.

Furthermore, in accordance with some embodiments of the present invention, the instructions include instruction to determine that the unnamed entity does not exist.

Furthermore, in accordance with some embodiments of the present invention, the instructions include instruction to ignore the refinement rule.

Furthermore, in accordance with some embodiments of the present invention, the instructions include instruction to present a refinement rule that is suspect for examination by a user.

There is further provided, in accordance with some embodiments of the present invention, a system including a storage device; and a processing unit in communication with the storage device and configured to: calculate a set of currently calculated values for a hardware emulation, each currently calculated value characterizing an element in a hierarchy of elements of the emulation; compare a currently calculated value of the set for a first element at a first level of the hierarchy with a stored previously calculated value that characterized the first element at a previous time; validate application of a refinement rule to an unnamed entity of the emulation when the currently calculated value that characterizes the first element is the same as the previously calculated value that characterized the first element at the previous time; compare each currently calculated value that characterizes a lower level element at a lower level of the hierarchy with a corresponding previously calculated value that characterized that lower level element at the previous time to identify a change in an element of the lower level elements when the currently calculated value that characterizes the first element is different from the previously calculated value that characterized the first element at the previous time; and determine whether the identified change invalidates application of the refinement rule to the unnamed entity.

Furthermore, in accordance with some embodiments of the present invention, the first element includes a model.

Furthermore, in accordance with some embodiments of the present invention, the lower level element includes a module, an instance of a module, or a concurrent block.

BRIEF DESCRIPTION OF THE DRAWINGS

In order to better understand the present invention, and appreciate its practical applications, the following Figures are provided and referenced hereafter. It should be noted that the Figures are given as examples only and in no way limit the scope of the invention. Like components are denoted by like reference numerals.

DETAILED DESCRIPTION OF THE INVENTION

In the following detailed description, numerous specific details are set forth in order to provide a thorough understanding of the invention. However, it will be understood by those of ordinary skill in the art that the invention may be practiced without these specific details. In other instances, well-known methods, procedures, components, modules, units and/or circuits have not been described in detail so as not to obscure the invention.

Although embodiments of the invention are not limited in this regard, discussions utilizing terms such as, for example, "processing," "computing," "calculating," "determining," "establishing", "analyzing", "checking", or the like, may refer to operation(s) and/or process(es) of a computer, a computing platform, a computing system, or other electronic computing device, that manipulates and/or transforms data represented as physical (e.g., electronic) quantities within the computer's registers and/or memories into other data similarly represented as physical quantities within the computer's registers and/or memories or other information non-transitory storage medium (e.g., a memory) that may store instructions to perform operations and/or processes. Although embodiments of the invention are not limited in this regard, the terms "plurality" and "a plurality" as used herein may include, for example, "multiple" or "two or more". The terms "plurality" or "a plurality" may be used throughout the specification to describe two or more components, devices, elements, units, parameters, or the like. Unless explicitly stated, the method embodiments described herein are not constrained to a particular order or sequence. Additionally, some of the described method embodiments or elements thereof can occur or be performed simultaneously, at the same point in time, or concurrently. Unless otherwise indicated, use of the conjunction "or" as used herein is to be understood as inclusive (any or all of the stated options).

An emulation system may be configured for test coverage refinement resilience of a hardware emulation. As used herein, a refinement rule refers to a rule that may be applied to an entity of the hardware emulation to exclude that entity from coverage or from testing.

Figure 1:
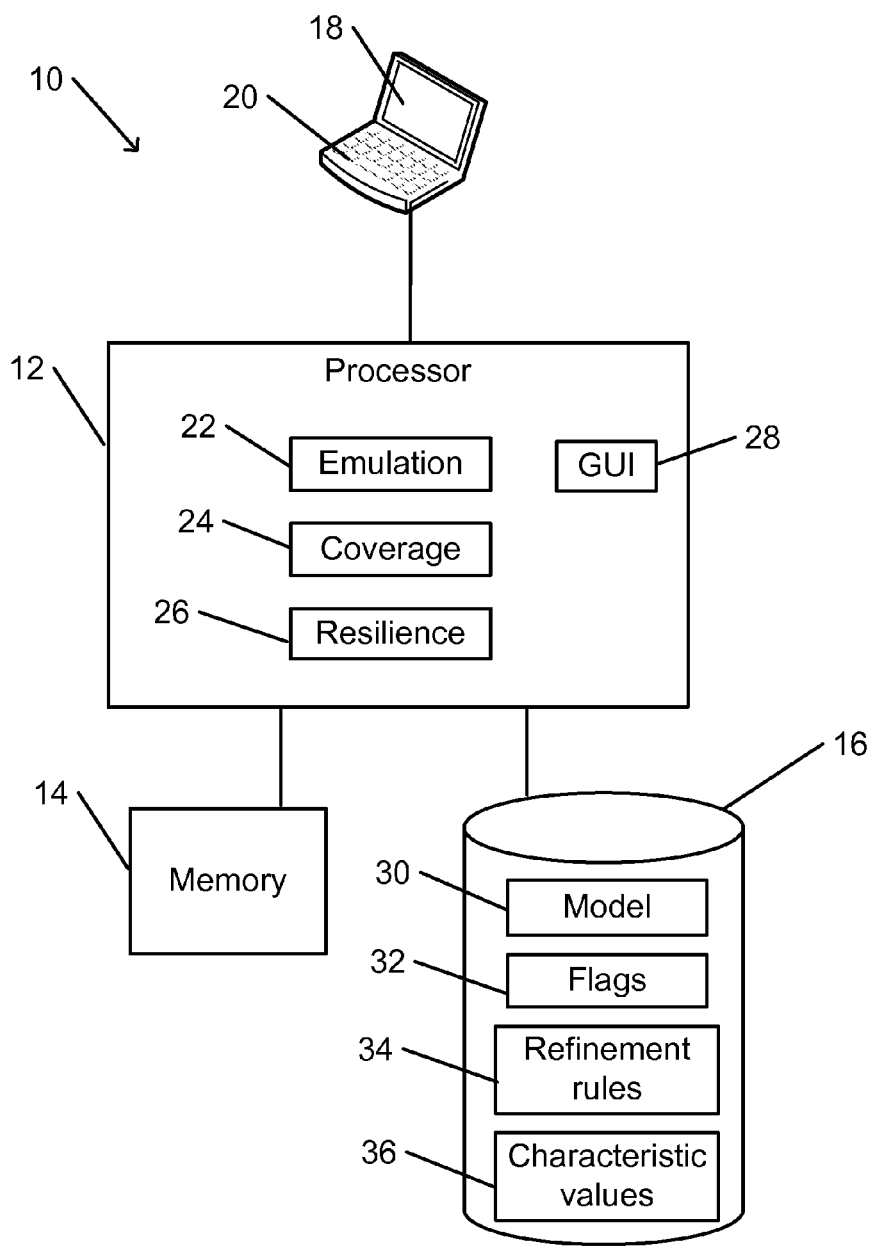
FIG. 1 is a schematic illustration of an emulation system that is configured for test coverage refinement resilience, in accordance with an embodiment of the present invention.

FIG. 1 is a schematic illustration of an emulation system that is configured for test coverage refinement resilience, in accordance with an embodiment of the present invention.

Emulation system 10 system 10 includes a processor 12. For example, processor 12 may include one or more processing units, e.g., of one or more computers. Processor 12 may be configured to operate in accordance with programmed instructions stored in memory 14. Processor 12 may be capable of executing an application for test coverage refinement resilience for a hardware emulation system.

Processor 12 may communicate with output device 18. For example, output device 18 may include a computer monitor or screen. Processor 12 may communicate with a screen of output device 18 to display a graphic user interface (GUI), a result of a test of a hardware emulation, a result of an application for test coverage refinement resilience, or another output. In another example, output device 18 may include a printer, display panel, speaker, or another device capable of producing visible or audible output.

Processor 12 may communicate with input device 20. For example, input device 20 may include one or more of a keyboard, keypad, pointing device, touch screen, microphone, or other device for enabling a user to inputting data or instructions for operation of processor 12.

Processor 12 may communicate with memory 14. Memory 14 may include one or more volatile or nonvolatile memory devices. Memory 14 may be utilized to store, for example, programmed instructions for operation of processor 12, data or parameters for use by processor 12 during operation, or results of operation of processor 12

Processor 12 may communicate with data storage device 16. Data storage device 16 may include one or more fixed or removable nonvolatile data storage devices. For example, data storage device 16 may include a computer readable medium for storing program instructions for operation of processor 12. It is noted that data storage device 16 may be remote from processor 12. In such cases, data storage device 16 may be a storage device of a remote server storing programmed instructions in the form of an installation package or packages that can be downloaded and installed for execution by processor 12. Data storage device 16 may be utilized to store data or parameters for use by processor 12 during operation, or results of operation of processor 12.

Data and instructions that are stored on data storage device 16 may be loaded to memory 14 for use by processor 12.

Processor 12 may interact with a user via GUI 28. Operation of GUI 28 may enable an user to input instructions or data via input device 20. Operation of UI 28 may enable presentation to a user of results of operation of processor 12 via output device 18.

Processor 12 may be configured to operate in accordance with programmed instructions to execute emulation 22. Execution of emulation 22 may emulate or test operation of a hardware component whose structure or functions is described by a stored model 30. For example, model 30 may be represented by code in an HDL or RDL. One or more configuration flags 32 may be assigned stored values, e.g., via input device 20 and GUI 28. Programmed instructions for execution of emulation 22 (e.g., RDL code) may be affected by the values that are assigned to configuration flags 32.

Processor 12 may be configured to execute coverage assessment 24 in accordance with stored refinement rules 34. Coverage assessment 24 may determine which entities of model 30 are covered by a test during execution of emulation 22. For example, refinement rules 34 may specify one or more entities that are excluded or exempted from coverage by a test that is executed as emulation 22. Refinement rules 34 may be defined by a user via input device 20 and GUI 28. When refinement rules 34 are defined, a set of characteristic values 36 that characterize various entities of model 30 and configuration flags 32 may be calculated and stored. For example, a characteristic value of characteristic values 36 may characterize a concurrent block of model 30 to which a refinement rule of refinement rules 34 applies. Refinement rules 34 and characteristic values 36 may be saved on data storage device 16 in a single refinement file or in separate files.

Processor 12 may be configured to execute refinement resilience module 26 to determine the validity of refinement rules 34 at the time of execution of coverage assessment 24. For example, refinement resilience module 26 may be executed prior to, or concurrent with, execution of coverage assessment 24, in order to assess the validity of refinement rules 34. Execution of refinement resilience module 26 may include calculating current characteristic values 36 that correspond to previous characteristic values that were calculated to characterize an entity of emulation 22 at a previous time, such as at the time that refinement rules 34 were defined. Execution of refinement resilience module 26 may include comparing the calculated characteristic values 36 with previously calculated characteristic values 36. The validity of one or more rules of refinement rules 34 may be determined in accordance with a set of rules or instructions. Refinement resilience module 26 may be configured to operate GUI 28 to notify a user of rules whose validity is suspect, or to solicit user input with regard to validity of suspect rules.

Emulation 22 may include various entities that may represent various subcomponents or functionalities of a hardware component being emulated. The software emulation may be written as code in a hardware description language (HDL) such as VHDL or Verilog. Various procedures, blocks, modules, instances of modules, and statements of the code may represent components or elements of functionality of the emulated hardware.

The emulation may include a plurality of concurrent blocks. Concurrent blocks may include procedures that may be executed asynchronously with respect to one another. For example, different concurrent blocks may emulate different elements of a hardware component that may operate concurrently. Execution of a procedure includes execution of statements of the procedure.

The software emulation may be modified by various actions of one or more users. For example, a user may add a statement to block of code, delete a statement from a block of code, or otherwise modify a block of code. A user may modify the value of a configuration flag or other parameter that may alter the form of compiled code, e.g., in the form of a representation of the code in a register transfer language (RTL). When the configuration flag is modified, one or more statements of a block of code may be automatically added, deleted, or modified. For example, a configuration flag may indicate whether or not an "else" statement is added automatically to the code that includes a user-defined "if" statement.

Some of the entities may be named. A named entity may be unambiguously identified after modification of the code. The name may be provided by a user (e.g., a name of a variable or procedure), or may be automatically generated.

An entity may be unnamed. For example, a statement in block of code may be defined by its position within a block of code. A modification to the code that adds or deletes a statement may affect identification of an unnamed entity. For example, an unnamed entity may be identified by a relative index that designates a position of a statement within block of code. After insertion or removal of another statement within the block of code, the position index may point to a different statement within the block. Similarly, a logical expression may be variously indexed (e.g., as entries in a truth table).

One or more refinement rules 34 may be defined by a user. For example, the refinement rule may exclude one or more named or unnamed entities from code coverage. When an entity is excluded, a test of performance of the software emulation is not required to test the excluded entity. Code coverage is calculated without regard for the excluded entities.

In some cases, a refinement rule 34 may refer to an unnamed entity. For example, a statement within a block of code may be excluded from coverage. In some cases, a modification to the code may affect identification of the unnamed entity. For example, if a statement is added or deleted within a block of code, a number or expression that is used to identify one unnamed entity (e.g., a pointer or reference to a statement that is defined identified by the position of the statement relative to the beginning of the block) may in fact point to another unnamed entity other than that to which the refinement rule was intended to apply. Similarly, identification of a possible value of a logical expression (e.g., as an index to a row of a truth table) may vary in accordance with how the expression is parsed. Thus, identification of an unnamed entity for application of a refinement rule may present a challenge. The unnamed entity is not identifiable by a name, and its other attributes, such as reference to source code, may change between the time that a refinement rule is defined and the time that the refinement rule is applied.

Thus, application of the refinement rule 34 without checking its validity could exclude an unnamed entity other than the one that the user intended to exclude (e.g., the wrong statement).

Execution of refinement resilience module 26 may verify validity of a refinement rule prior to its application. Verification may include calculating a hierarchal set of characteristic values 36 that each characterizes an entity in the code. For example, the hierarchy may include modules, instances of modules, and concurrent blocks. An entity at a higher level of the hierarchy may include one or more entities at lower levels of the hierarchy.

Verification may include comparing the calculated characteristic values 36 against corresponding values of a previous set of characteristic values 36. For example, the previous set of characteristic values may have been calculated at the time that a refinement rule was formulated by a user. The previous set of characteristic values may have been calculated at the time that a refinement file that includes a set of refinement rules was created or updated.

For example, a calculation of a characteristic value of an entity may include application of a hash function to produce a hash value that characterizes the content of the entity. For example, the MD5 algorithm or another hash algorithm may be applied. For example, each character of executable code (e.g., excluding spaces and comments) may have a numerical value, e.g., in accordance with American Standard Code for Information Interchange (ASCII) encoding. Another system may be used to assign values to elements of the code such as variables, constants, flag states, operators, relations, parameters, character strings, or other elements of the code. A simple checksum may be calculated for an entity (e.g., concurrent block) that includes the code by calculating a sum of the values of the elements of the code. A more complex hash algorithm may take into account the order of the characters or elements of the block such that the value is sensitive to any change in the entity. Characteristic values may be calculated using one or more arithmetic, modular, bitwise, or other operations.

A hierarchal set of characteristic values 36 may be calculated. For example, each element at each hierarchal level of the code may be characterized by a separate characteristic value. For example, elements of the code at different hierarchal levels for which characteristic values may be calculated may include the entire model, and components of the model such as instances, modules, concurrent blocks, blocks, statements, expressions, or other elements of the code. A level of an element within the hierarchy may be determined by broadness of applicability of that element. A module of which there are, or could be, a plurality of instances may be placed at a higher level than an instance of the module. A module, instance, or concurrent block that includes a plurality of components such as blocks, expressions, or statements may be placed at a higher level than any of its components.

When a test is to be run, the set of calculated characteristic values 36 may be hierarchically compared to a set of previous characteristic values. For example, the previous characteristic values may have been calculated at the time that one or more refinement rules were defined.

The comparison may begin at the highest (broadest) level of the hierarchy. For example, the calculated characteristic value for the entire model may be compared with a previous characteristic value for the model.

If the highest level calculated characteristic value matches the corresponding highest level previous characteristic value, then highest level of the hierarchy, e.g., that of the entire model, may be assumed to be unchanged such that references to unnamed entities likewise remain unchanged. When references to unnamed entities remain unchanged since when a refinement rule was defined, then a refinement rule with regard to the unnamed entities may be assumed to retain its validity.

If a calculated characteristic value does not match the corresponding previous characteristic value at a level, then the calculated and previous values are hierarchically compared for the lower levels of the hierarchy. As used herein, a hierarchal comparison includes recursively comparing all values for elements at the next lower level of the hierarchy below the level at which a mismatch was found. The hierarchal comparison continues until one or more mismatches are found for elements at the lowest level of the hierarchy (e.g., for an individual statement or expression). The elements for which the calculated characteristic value does not match the previous characteristic value may be identified as changed.

When an element is identified as changed, one or more predetermined validity rules may be applied to determine whether the identified change invalidates a refinement rule with respect to an unnamed entity. As used herein, a refinement rule in invalidated or determined to be invalid when the identity of an unnamed entity to which the refinement rule applies is no longer certain to be that for which the refinement rule was defined.

In some cases, an invalidated refinement rule may be automatically identified as incorrect. For example, the incorrect refinement rule may be identified as referring to an unnamed entity other than the unnamed entity for which the refinement rule was defined. In some cases, the incorrect refinement rule may be identified as referring to an unnamed entity that no longer exists (e.g., as a result of modification of a configuration flag). In some cases, an invalidated refinement rule may be identified as requiring user input to determine whether the refinement rule is correct or incorrect.

An invalidated refinement rule may be automatically treated or resolved. For example, a refinement rule may exclude from code coverage an unnamed entity in the form of a statement that is identified by its position in a block. The refinement rule may be invalidated because of insertion of one or more statements into the block. The inserted statements may be automatically identified. Thus, the correct unnamed entity to which the refinement rule is to be applied may be automatically identified (e.g., by adding the number of inserted statements to a pointer to the excluded statement).

As another example, an excluded statement may be removed from a block. For example, the excluded statement may have been automatically created due to a setting of a configuration flag (e.g., an implicit "else" statement that is added to an "if" statement). If the configuration flag is changed, the excluded statement may be removed. In this case, the refinement rule may be automatically identified as not relevant, and as not to be applied.

In some cases, an invalidated refinement rule cannot be treated automatically. For example, the invalidation may result from a user modification to the code that cannot be identified automatically, such that the validity of the refinement rule is suspect. In some cases, a particular identified modification may not be supported by an appropriate validation rule. In this case, the invalidated refinement rule may be presented to a user. For example, GUI 28 may be configured to display a list of invalidated refinement rules (sometimes referred to as "orphan" refinement rules) that require user attention. The user may input instructions for resolving one or more invalidated refinement rules (e.g., a modification of a refinement rule, a configuration flag, RTL code, or another modification), or may indicate approval of the refinement rules in their current state.

In operation, processor 12 may execute a method for test coverage refinement resilience.

Figure 2:
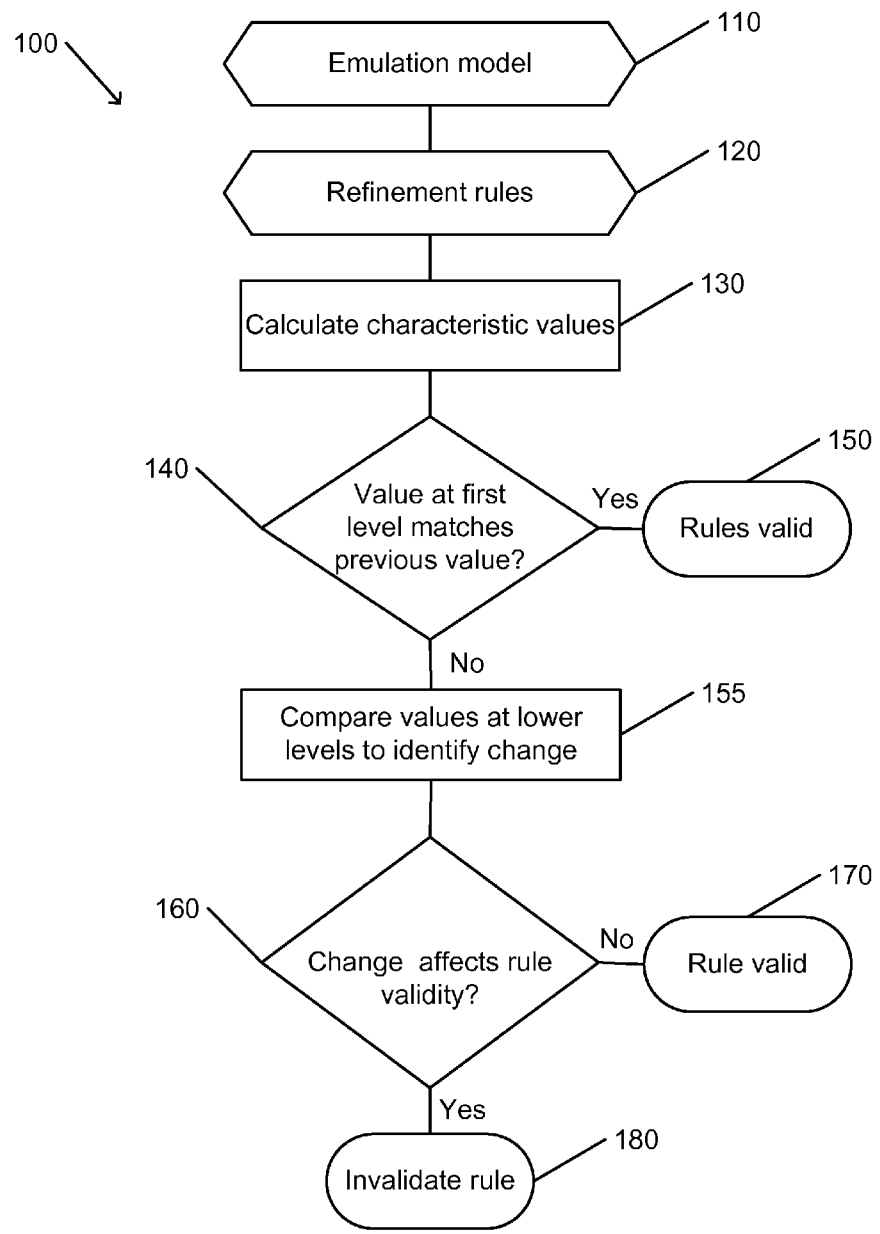
FIG. 2 is a flowchart depicting a method for test coverage refinement resilience, in accordance with an embodiment of the present invention.

FIG. 2 is a flowchart depicting a method for test coverage refinement resilience, in accordance with an embodiment of the present invention.

It should be understood, with respect to any flowchart referenced herein, that the division of the illustrated method into discrete operations represented by blocks of the flowchart has been selected for convenience and clarity only. Alternative division of the illustrated method into discrete operations is possible with equivalent results. Such alternative division of the illustrated method into discrete operations should be understood as representing other embodiments of the illustrated method.

Similarly, it should be understood that, unless indicated otherwise, the illustrated order of execution of the operations represented by blocks of any flowchart referenced herein has been selected for convenience and clarity only. Operations of the illustrated method may be executed in an alternative order, or concurrently, with equivalent results. Such reordering of operations of the illustrated method should be understood as representing other embodiments of the illustrated method.

Refinement resilience method 100 may be executed by a processor of a system for hardware component emulation where coverage is subject to refinement rules. Refinement resilience method 100 may be executed upon a request or command that is issued by a user, or automatically issued by another application. For example, refinement resilience method 100 may be executed automatically prior to application of refinement rules, e.g., when reading or loading a refinement file. Refinement rules may be applied prior to running a test on the emulation or prior to calculating coverage by the test. As another example, refinement resilience method 100 may be executed automatically whenever a change is introduced into user generated code or into automatically generated code (e.g., generated automatically in response to user modification of a flag or other parameter that controls compilation or other processing of the code).

Refinement resilience method 100 may be executed in connection with an emulation model (block 110). The emulation model may be configured to emulate structure or function of a hardware component. The emulation may be represented by code in an HDL or RDL. The emulation model may include one or more concurrent blocks that emulate subcomponents of the emulated hardware component that may operate concurrently. Code of the model may be configured in accordance with user-assigned values to one or more configuration flags. The code may include statements and expressions, and may include named entities and unnamed entities.

One or more refinement rules may be defined (block 120). The refinement rules may determine which statements in the code of the emulation, and which values of expressions in the code, are required or not required to be covered by a test of the emulation. Some of the refinement rules may refer to unnamed entities.

Values that characterize various entities and elements of the currently loaded code may be calculated (block 130). For example, a characteristic value may be calculated by applying a hash function to executable code of the various elements. The hash function may yield a unique value that depends both on the content of the code element (e.g., character content), and on the order of the content. The characteristic value or the hash function may yield a value that also depends on current values of various flags or other parameters. Characteristic values may be calculated for elements at various levels of hierarchy of elements. For example, a calculated characteristic value at the top of the hierarchy may characterize the entire model. Calculated values may characterize modules of the code, or instances of modules. Calculated values may characterize concurrent blocks of the code. Calculated values may characterize blocks, statements, or expressions in the code.

The currently calculated values that characterize an element at a first level of the hierarchy, e.g., the highest level of interest, may be compared with previously calculated values that characterize that element (block 140). For example the element at the first level may include the entire emulation model. The previously calculated values may have been calculated at a previous time, e.g., at the time of definition of one or more refinement rules whose validity is to be evaluated. For example, the previously calculated values may be saved in a refinement file that includes definitions of the refinement rules.

If the currently calculated value for the element at the first level matches the previously calculated value for that element, then the refinement rules for all code that is relevant to the first value are valid (block 150). For example, if the element at the first level represents that entire model, then all refinement rules relating to the code for the model may be assumed to be valid.

If the currently calculated value for the element at the first level does not match the previously calculated value for that element, then calculated values for elements at lower levels of the hierarchy are compared with the corresponding previously calculated values for those elements (block 155).

For example, a characteristic value may characterize content, e.g., executable code content, of a concurrent block. The characteristic value may also characterize current values of configuration flags or of other flags or parameters. In some cases, e.g., when the characteristic value is calculated by application of a sophisticated hash function, the characteristic value may be considered to uniquely identify the concurrent block. For example, the concurrent block may include a block, statement or expression, or another unnamed entity, to which a refinement rule is intended to apply. In this case, the currently calculated characteristic values of various concurrent blocks may be examined to find a match to each previously calculated characteristic value. If no match is found for one or more of the previously calculated characteristic values, the code may be considered to have been modified since the time of definition of a refinement rule.

An identified change may be evaluated to determine whether a refinement rule is invalidated (block 160). For example, an identified change in a value of a configuration flag may be compared against a list of supported configuration flags. A supported configuration flag may include a configuration flag whose value may be changed without impacting refinement rules. A configuration flag may be include included in the list of supported configuration flags when application of a refinement rule may be automatically adapted to the change in value of the configuration flag. As another example, an identified change may indicate that an entity to which a refinement rule applies no longer exists.

If the identified change does not affect validity of a refinement rule, then the refinement rule may be considered to be valid (block 170). For example, the rule may be marked as valid or may be load for application when testing the emulation and calculating coverage. In some cases, marking or otherwise considering a refinement rule to be valid may be preceded by automatically adapting the configuration rule to the detected change. For example, a pointer or reference to a statement may be amended to accommodate an identified change that includes insertion or deletion of a statement.

For example, a configuration flag whose value is identified as having changed may be included in a list of supported configuration flags. When so included, the refinement rule may be applied, or may be applied after automatically adapting the refinement rule to the identified change in the value of the configuration flag.

As another example, the identified change may affect only those entities to which a refinement rule does not apply.

If the identified change is identified as affecting validity of one or more refinement rules, those refinement rules may be invalidated (block 180). A refinement rule may be considered invalid when application of that rule is evaluated as not certain to yield an intended result (e.g., excluding an originally indicated statement or expression from coverage).

For example, a refinement rule may be invalidated when it applies to an unnamed entity that is detected as no longer existing (e.g., deleted by a user or automatically deleted, e.g., in response to a change in value of a configuration flag). In such a case, the refinement rule may be ignored when calculating coverage of a test of the emulation.

In some cases, correct application of a refinement rule may not be automatically determined. In such a case, the refinement rule may be considered to be suspect (possibly correctly applied or possibly incorrectly applied). For example, RTL code may have been changed by a user, or a value of an unsupported configuration flag may have been changed. In some cases, the cause of the change cannot be determined automatically. In such cases, predetermined automatically applied instructions may not cover the particular case to automatically determine if the refinement rule will be applied to the intended entity. The invalidated refinement rule may be identified as suspect. The suspect refinement rule may be presented to a user for review or examination by a user. For example, the rule may be included in a displayed list of invalid or suspect refinement rules. Such a displayed list may also include an indication of a reason for the invalidation, and may indicate or enable viewing of code to which the refinement rule is designated to apply or which may have changed. A user interface may enable the user to either restore the refinement rule (e.g., to mark the refinement rule as valid) or to alter or delete the refinement rule.

A method for refinement resilience, in accordance with an embodiment of the present invention, may be advantageous.

After a rule is indicated as being suspected to be invalid, a user may continue working with other refinement rules or otherwise continue work with the model. Changes may be saved to a new refinement file. For example, a user who does wish to address the suspected refinements (e.g., whose primary assignment is to work on other aspects of the model, or whose are of expertise does not relate to the suspected refinements) may continue working with the model while another user addresses the refinements that are suspected of being invalid.

Figure 3:
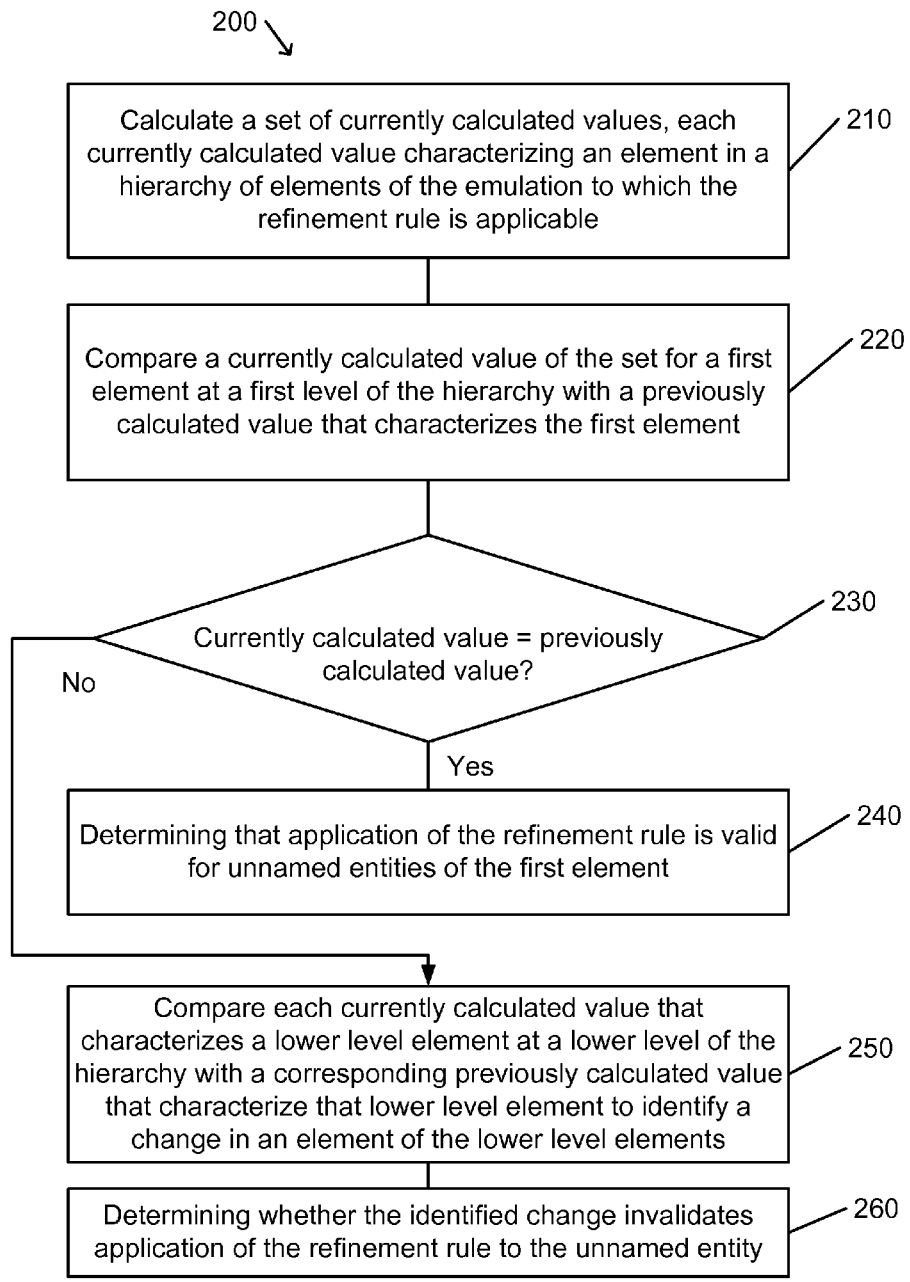
FIG. 3 is a flowchart depicting a method for automatically verifying validity of a refinement rule with regard to an unnamed entity of a hardware emulation.

FIG. 3 is a flowchart depicting a method for automatically verifying validity of a refinement rule with regard to an unnamed entity of a hardware emulation.

Method 200 includes calculating a set of currently calculated values, each currently calculated value characterizing an element in a hierarchy of elements of the emulation to which the refinement rule is applicable (block 210).

A currently calculated value of the set for a first element at a first level of the hierarchy is compared with a previously calculated value that characterizes the first element (block 220).

If the currently calculated value that characterizes the first element is the same as the previously calculated value that characterizes the first element (block 230), the refinement rule is determined to be valid for unnamed entities of the first element (block 240).

The currently calculated value that characterizes the first element may be different from the previously calculated value that characterizes the first element (block 230). Each currently calculated value that characterizes a lower level element at a lower level of the hierarchy is then compared with a corresponding previously calculated value that characterize that lower level element to identify a change in an element of the lower level elements (block 250). It is determined whether the identified change invalidates application of the refinement rule to the unnamed entity (block 260.

Different embodiments are disclosed herein. Features of certain embodiments may be combined with features of other embodiments; thus certain embodiments may be combinations of features of multiple embodiments. The foregoing description of the embodiments of the invention has been presented for the purposes of illustration and description. It is not intended to be exhaustive or to limit the invention to the precise form disclosed. It should be appreciated by persons skilled in the art that many modifications, variations, substitutions, changes, and equivalents are possible in light of the above teaching. It is, therefore, to be understood that the appended claims are intended to cover all such modifications and changes as fall within the true spirit of the invention.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

The invention claimed is:

1. A method for automatically verifying validity of application of a refinement rule, the method comprising:
using a processor, calculating a set of currently calculated values, each currently calculated value characterizing an element in a hierarchy of elements after a modification of a hardware emulation code, wherein an element at each level of the hierarchy is more broadly applicable than an element at a lower level, and storing the currently calculated values in a storage device, at least one of the elements including one or more unnamed entities;

using the processor, comparing a currently calculated value of the set for a first element at a highest level of the hierarchy with a previously calculated value that is stored in the storage device and that characterized the first element at a previous time when a refinement rule that specifies an unnamed entity of said one or more unnamed entities that is excluded from test coverage was defined;

determining that application of the refinement rule remains valid if the currently calculated value that characterizes the first element is the same as the previously calculated value that characterized the first element at the previous time; and if the currently calculated value that characterizes the first element is different from the previously calculated value that characterized the first element at the previous time:

using the processor, comparing each currently calculated value that characterizes a lower level element at a lower level of the hierarchy with a corresponding previously calculated value that is stored in the storage device and that characterized that lower level element at the previous time to identify a change in an element of the lower level elements; and using the processor, determining whether the identified change, invalidates application of the refinement rule to that unnamed entity.

2. The method of claim 1, wherein the first element comprises a model.

3. The method of claim 1, wherein the characteristic value is indicative of a value of a configuration flag.

4. The method of claim 1, wherein calculating a value of the set of the currently calculated values for an element of the hierarchy of elements comprises applying a hash function to that element.

5. The method of claim 4, wherein the hash function is further applied to a current value of a configuration flag.

6. The method of claim 1, wherein an element of the lower level elements comprises a module, an instance of a module, or a concurrent block.

7. The method of claim 1, further comprising automatically adapting the refinement rule to the element including the change.

8. The method of claim 1, wherein the identified change comprises an unnamed entity that does not exist in the element including the change.

9. The method of claim 1, further comprising ignoring the refinement rule during a test.

10. The method of claim 1, further comprising presenting a refinement rule that is suspect for examination by a user in a displayed list.

11. A non-transitory computer readable storage medium having stored thereon instructions that when executed by a processor will cause the processor to perform the method of:

calculating a set of currently calculated values for a hardware emulation after a modification of a hardware emulation code, each currently calculated value characterizing an element in a hierarchy of elements of the emulation code, wherein an element at each level of the hierarchy is more broadly applicable than an element at a lower level, at least one of the elements including one or more unnamed entities, and storing the currently calculated values in a storage device;

comparing a currently calculated value of the set for a first element at a highest level of the hierarchy with a previously calculated value that is stored in the storage device and that characterized the first element at a previous time when a refinement rule that specifies an unnamed entity of said one or more unnamed entities that is excluded from test coverage was defined;

determining that application of the refinement rule to that unnamed entity remains valid if the currently calculated value that characterizes the first element is the same as the previously calculated value that characterized the first element at the previous time;

comparing each currently calculated value that characterizes a lower level element at a lower level of the hierarchy with a corresponding previously calculated value that is stored in the storage device and that characterized that lower level element at the previous time to identify a change in an element of the lower level elements if the currently calculated value that characterizes the first element is different from the previously calculated value that characterized the first element at the previous time; and determining whether the identified change, invalidates application of the refinement rule to that unnamed entity.

12. The computer readable storage medium of claim 11, wherein the instructions include instruction to apply a hash function to an element of the hierarchy of elements to calculate a value of the set of currently calculated values that characterizes that element.

13. The computer readable storage medium of claim 12, wherein said element of the hierarchy of elements comprises a model, a module, an instance of a module, or a concurrent block.

14. The computer readable storage medium of claim 11, wherein the instructions include instruction to automatically adapt the refinement rule to the element including the change.

15. The computer readable storage medium of claim 11, wherein the instructions include instruction to determine that the unnamed entity does not exist in the element including the change.

16. The computer readable storage medium of claim 11, wherein the instructions include instruction to ignore the refinement rule during a test.

17. The computer readable storage medium of claim 11, wherein the instructions include instruction to present a refinement rule that is suspect for examination by a user in a displayed list.

18. A system comprising:

a storage device; and a processing unit in communication with the storage device and configured to:

calculate a set of currently calculated values for a hardware emulation code, each currently calculated value characterizing an element in a hierarchy of elements of the emulation, wherein an element at each level of the hierarchy is more broadly applicable than an element at a lower level, at least one element including one or more unnamed entities;

compare a currently calculated value of the set for a first element at a highest level of the hierarchy with a stored previously calculated value that characterized the first element at a previous time when a refinement rule that specifies an unnamed entity of said one or more unnamed entities that is excluded from test coverage was defined;

validate application of the refinement rule to that unnamed entity when the currently calculated value that characterizes the first element is the same as the previously calculated value that characterized the first element at the previous time;

compare each currently calculated value that characterizes a lower level element at a lower level of the hierarchy with a corresponding previously calculated value that characterized that lower level element at the previous time to identify a change in an element of the lower level elements when the currently calculated value that characterizes the first element is different from the previously calculated value that characterized the first element at the previous time; and determine whether the identified change invalidates application of the refinement rule to the unnamed entity.

19. The system of claim 18, wherein the first element comprises a model.

20. The system of claim 18, wherein the lower level element comprises a module, an instance of a module, or a concurrent block.

\* \* \* \* \*